Jan. 25, 1966 A. R. WALTZ ETAL 3,231,133

ESCAPEMENT MECHANISM

Filed Oct. 29, 1964

Paul R. Peterson,
Albert R. Waltz,
INVENTORS.
BY.

W H McAllister Jr.

ATTORNEY.

United States Patent Office 3,231,133
Patented Jan. 25, 1966

3,231,133
ESCAPEMENT MECHANISM
Albert R. Waltz, Fullerton, Calif., and Paul R. Peterson, Norwich, Conn., assignors to Hughes Aircraft Company, Culver City, Calif., a corporation of Delaware
Filed Oct. 29, 1964, Ser. No. 407,446
1 Claim. (Cl. 221—299)

This is a continuation-in-part of Serial No. 271,269, filed April 8, 1963 by the same inventors and assigned to the instant assignee, and now abandoned.

This invention relates to apparatus for physically organizing objects and articles into a predetermined arrangement and then discharging such objects and articles in a controlled sequential fashion. More particularly, but not necessarily exclusively, the invention relates to apparatus for discharging sequentially semiconductor devices from an organized disposition so that the devices may be quickly presented to one or more work stations for the performance of some desired operation thereon.

It will be appreciated that certain semiconductor devices such as diodes with coaxially-extending electrical leads must, at several stages in their assembly and fabrication, be physically arranged in a uniform manner for presentation sequentially to a particular operation. Thus, for example, it is desirable to paint diodes of like electrical characteristics according to a predetermined color code. In other instances it is sometimes desirable to mount the finished diodes in belt-like fashion on adhesive tape or the like as described in U.S. Patent No. 2,915,212 assigned to the instant assignee. P. B. Cason in U.S. Patent No. 2,975,878, also assigned to the instant assignee, describes apparatus which by means of a chute physically arranges diodes and the like and then discharges the diodes in a sequential fashion from the chute. In Cason's patented apparatus the chute is formed by a pair of parallel plates having a vertically-extending slit so that the package body or tubular portion is contained between the plates with the coaxial wire leads thereof extending through the slit and outside the plates. The semiconductor devices are held in the chute and discharged sequentially by means of a pair of retaining triggers each having an angularly disposed paw. These triggers are disposed on the outside of the plates on each side of the chute with their paws extended toward each other and displaced somewhat vertically and adapted to act upon the leads of the diode so as to retain the same in the chute and to release the diodes one at a time therefrom. It will be appreciated that from time to time the paws or hooks of the triggers may not properly engage the wire leads so that these leads may actually be bent or become jammed in the mechanism. In addition, the triggers must be somewhat precisely disposed in the plates which tends to severely limit the subsequent adjustment or alteration thereof should the diameter of the diode bodies, for example, be changed.

It is, therefore, an object of the present invention to provide an improved escapement mechanism for retaining objects, especially electronic components, in a chute and discharging the same in sequential fashion therefrom.

Another object of the invention is to provide an improved apparatus in which objects, especially electronic components, having coaxially-extending leads may be discharged in a predetermined sequential fashion.

These, and other objects and advantages of the invention, are realized by providing a chute-like container adapted to maintain an array of articles or objects one above the other, for example, in combination with an escapement mechanism comprising a thin ribbon-like strip of metal which is doubled around a shaft so that its two ends extend in the same direction and are spaced by a predetermined amount from each other. The strip is so fastened to the shaft as to be rotatable therewith so that partial rotation of the shaft results in one end of the strip being moved in one direction and the other end in the opposite direction. Hence, one end of the strip may be extended so as to support an array or column of electronic components thereupon. Upon partial rotation of the shaft the other end of the strip will move between the lowermost component and the remaining array of components so as to retain the same while the other end will be withdrawn to release only the lowermost component from the container.

The invention will be described in greater detail by reference to the drawings in which.

Figure 1:
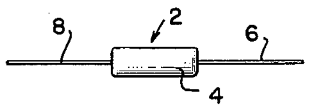
FIGURE 1 is an elevational view of a semiconductor diode suitable for use with the mechanism of the invention.

Referring now to the drawings, FIGURE 1 shows a semiconductor diode device 2 comprising a glass package or container 4 in which a semiconductor device (not shown) or other electrical device may be disposed. Coaxially-extending from each end of the glass package are electrical leads 6 and 8 which provide electrical connection to the device inside the glass package 4. While the practice of the invention is not limited to handling only semiconductor devices of the type shown in FIGURE 1, it is particularly useful in this connection. It will be appreciated, however, that other types of objects or components, either electrical or mechanical, may be arrayed for sequential discharge from the stack and advantageously handled by and in the apparatus of the invention.

Referring now to FIGURES 2, 3, 4, and 5, a chute 10 is shown in which a component such as the diode 2 of the FIGURE 1 may be vertically stacked for sequential discharge from the bottom thereof. This chute 10 comprises a pair of plates 12 and 14 which may be of electrically insulating material and transparent, for example, to permit easy visibility of the apparatus and the devices passing therethrough. The plates 12 and 14 may be bolted to each other so as to provide a space therebetween slightly larger than the longest dimension of the glass package 4 of the semiconductor device 2 when contained therebeween. In the case of components such as the diode 2 having coaxially-extending lead wires, the plates 12 and 14 are provided with a pair of matched and aligned slots 11 running from the top to the bottom thereof into which slots the coaxially-extending leads extend. It will thus be understood that the diode 2 may be inserted between the plates 12 and 14 at the top of the chute 10 as from a hopper or the like so that the leads 6 and 8 extend through the slots 11 thereof.

Mounted adjacent the bottom and between the chute plates 12 and 14 is a frame support member 15 in which is mounted a drum 16 and an electric motor 18 which is adapted to partially rotate the drum 16. The drum 16 may be mounted conveniently on the shaft 19 of the motor 18, for example. The motor 18 may be of the solenoid type and adapted to make a quarter-turn in one direction and then a quarter-turn in the opposite direction, for example. The operation of such motors is well known in the art and need not be further described in detail herein. The drum 16 is so mounted in the frame support 15 that its axis is parallel to the axes of the diodes 2 in the chute 11; in other words the drum extends in the same direction as the glass body 4 of the diodes in the chute 11.

Figure 2:
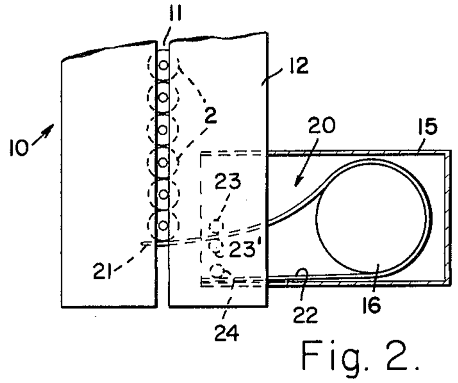
FIGURE 2 is an elevational view of the escapement mechanism of the invention at one stage of the operation and in the normal "off" or closed position thereof.
Figure 6:
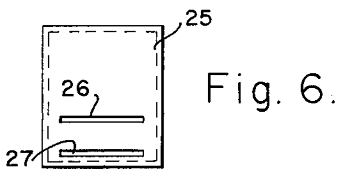
FIGURE 6 is an end view of a suitable strip guiding plate for use in the apparatus shown in FIGURES 2, 3, and 4, according to an alternative embodiment.

Mounted around the drum 16 is a flexible ribbon-like strip of metal 20. This metal strip 20, which is relatively thin, may be secured to the drum by a set-screw or the like so as to be rotatable therewith. The metal strip 20 is noncontinuous and has two free ends which may be guided by transverse guide rods so as to extend between the chute plates 12 and 14 and toward the array of diodes stacked between the plates 12 and 14. The upper end 21 of the metal strip 20 extends between a pair of transverse guide rods 23, 23′ so as to be guided and supported thereby. The lower end 22 of the metal strip 20 extends between the bottom plate of the frame support 15 and a transverse guide rod 24 so that it may be guided and retained in position. As shown in FIGURE 6 an alternative embodiment may be utilized for supporting and guiding the ends of the metal strip 20. In this embodiment a vertically extending plate 25 is disposed across the end of the frame member 15 and adjacent the chute 10. This vertical plate 25 is provided a pair of parallel transversely extending slots 26 and 27 through which the ends 21 and 22 of the metal strip 20 may be extended. As shown in FIGURE 2 when the drum is turned to the full counter-clockwise position, the upper end 21 of the strip 20 extends across the stack of diodes so that the lowermost diode in the stack rests upon this extended end 21.

Figure 3:
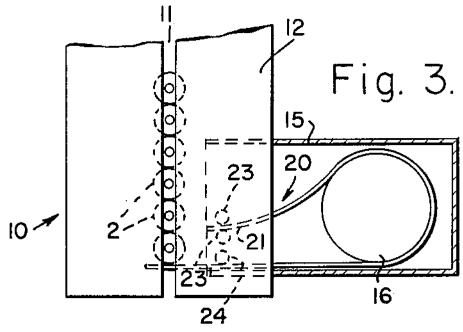
FIGURE 3 is an elevational view of the escapement mechanism of the invention in the first phase of the operation thereof.

As shown in FIGURE 3, upon full clockwise rotation of the drum 16, the upper end 21 of the strip 20 will be drawn away from the diode stack or array while the lower end 22 is extended across the diode stack whereby the lowermost diode is released or dropped by the upper end 21 of the strip 20 so as to now rest on the lower end 22 thereof. It will be appreciated that adjustments may be made by moving the aforementioned guide rods 23, 23′ and 24 further apart or closer together so as to maintain the distance between the ends 21 and 22 of the strip 20 about equal to the diameter of the glass body 4 of the diodes in the stack. Similar adjustments may be made in the embodiment shown in FIGURE 6 by moving the transverse slots 26 and 27 closer together or further apart.

Figure 4:
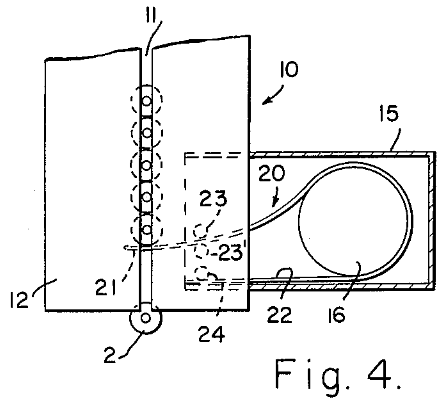
FIGURE 4 is an elevational view of the escapement mechanism of the invention in the second phase of the operation thereof.
Figure 5:
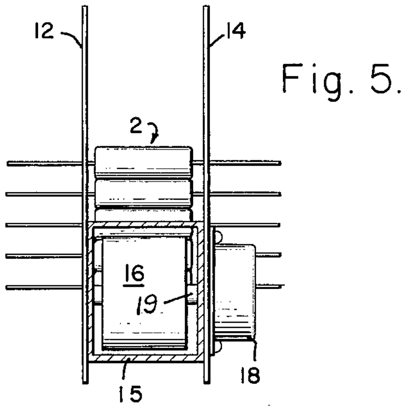
FIGURE 5 is a front view of the apparatus shown in FIGURES 2, 3, and 4.

As shown in FIGURE 4 upon the next counter-clockwise rotation of the drum, the lower strip 22 is caused to withdraw from the diode stack array and the upper strip 21 is caused to extend into the diode stack. The lowermost diode is thereby released from any support and drops through the chute while the next lowermost diode is supported by the upper end 21 of the flexible strip 20. Thus by rotating the shaft in oscillating fashion (that is in alternate directions) first one end and then the other end of the strip is inserted into the array to retain the terminal diode in the array while permitting the discharge therefrom of the previous terminal diode.

While in the drawings the ends of the strip 20 are shown as penetrating substantially more than halfway through the array or stack of diodes, it will be appreciated that this is not necessary to achieve the objects of the invention. To prevent an object or diode from falling through the chute it is only necessary that the end of the strip 20 extend within the stack so that the end is less than a radius away from the center of the diodes or other articles in the stack. Hence, the ends of the strip 20 only need be inserted partially into the array for proper functioning according to the invention.

In this manner a relatively simple and foolproof mechanism is provided for sequentially discharging components such as coaxial-lead diodes from a vertical stack by acting upon the relatively more rugged glass package portion of the diode rather than upon the easily bendable leads as was the practice in the prior art.

What is claimed is:

In combination, means to hold a vertically disposed array of objects in sequential relationship, a flexible strip member secured to and around a rotatable support member and having vertically spaced end portions extending away from said support member and toward said vertical array, guide means for supporting and maintaining said end portions of said flexible strip member a predetermined distance apart, a frame member for supporting said rotatable member and said guide means, and motor means to rotate said support member in oscillating fashion whereby said end portions of said strip member are moved in opposite directions with respect to each other and alternately inserted at least partially into said array of objects to permit at least a terminal one of said objects to be released from said array during each oscillating cycle while preventing release of the remaining objects in said array.

References Cited by the Examiner

UNITED STATES PATENTS

| | | | |
|---|---|---|---|
| 2,840,265 | 6/1958 | Noyes | 221—293 X |
| 2,892,569 | 6/1959 | Sinclair | 221—299 |
| 2,960,259 | 11/1960 | Aveni | 221—299 X |

LOUIS J. DEMBO, *Primary Examiner.*

KENNETH N. LEIMER, *Examiner.*